US007576518B2

(12) United States Patent
Sanders et al.

(10) Patent No.: US 7,576,518 B2
(45) Date of Patent: Aug. 18, 2009

(54) BATTERY MONITORING NETWORK

(75) Inventors: David Edwin Sanders, Christchurch (NZ); Zifang Ma, Christchurch (NZ); Adnan Al-Anbuky, Christchurch (NZ)

(73) Assignee: Eaton Power Quality Company, Christchurch (NZ)

( * ) Notice: Subject to any disclaimer, the term of this patent is extended or adjusted under 35 U.S.C. 154(b) by 983 days.

(21) Appl. No.: 10/363,460

(22) PCT Filed: Sep. 4, 2001

(86) PCT No.: PCT/NZ01/00182

§ 371 (c)(1),
(2), (4) Date: Aug. 6, 2003

(87) PCT Pub. No.: WO02/21662

PCT Pub. Date: Mar. 14, 2002

(65) Prior Publication Data

US 2004/0027094 A1 Feb. 12, 2004

(30) Foreign Application Priority Data

Sep. 4, 2000 (NZ) ...................................... 506674

(51) Int. Cl.
*H02J 7/00* (2006.01)
*H02J 7/04* (2006.01)
*H04B 1/44* (2006.01)

(52) U.S. Cl. ...................... 320/150; 320/116; 320/120; 320/149; 370/282

(58) Field of Classification Search ................. 320/116, 320/120, 149, 150; 370/282; 364/483; 700/293
See application file for complete search history.

(56) References Cited

U.S. PATENT DOCUMENTS

| 4,876,513 | A | 10/1989 | Brilmyer et al. ............ 324/427 |
| 4,952,862 | A | 8/1990 | Biagetti et al. ................ 320/48 |
| 5,130,659 | A | 7/1992 | Sloan ......................... 324/435 |

(Continued)

FOREIGN PATENT DOCUMENTS

EP 0 714 033 5/1996

(Continued)

OTHER PUBLICATIONS

Sanjay Deshpande, David Shaffer and Joseph Szymborski. Intelligent Monitoring System Satisfies Coustomer Needs for Continuous Monitoring and Assurance on VRLA Batteries. Intelec 99. IEEE 1999.*

(Continued)

*Primary Examiner*—Edward Tso
*Assistant Examiner*—Yalkew Fantu
(74) *Attorney, Agent, or Firm*—Myers Bigel Sibley & Sajovec, P.A.

(57) ABSTRACT

A battery monitoring network including a battery node (6); one or more distributed nodes of a first class (4) each including means for acquiring first battery variable information, processing means adapted to manipulate the first battery variable information, and a communication means for communicating with a battery node; and one or more distributed nodes of a second class (5) each including means for acquiring second battery variable information, processing means adapted to manipulate the second battery variable information, and a communication means for communicating with the battery node.

26 Claims, 8 Drawing Sheets

U.S. PATENT DOCUMENTS

| | | | | |
|---|---|---|---|---|
| 5,371,682 | A | 12/1994 | Levine et al. | 364/483 |
| 5,587,660 | A | 12/1996 | Chabbert et al. | 324/426 |
| 5,587,924 | A | 12/1996 | Rossi | 364/496 |
| 5,619,417 | A * | 4/1997 | Kendall | 702/63 |
| 5,663,626 | A | 9/1997 | D'Angelo et al. | 318/799 |
| 5,694,335 | A * | 12/1997 | Hollenberg | 726/16 |
| 5,773,962 | A | 6/1998 | Nor | 320/134 |
| 5,786,640 | A | 7/1998 | Sakai et al. | 290/17 |
| 5,822,495 | A | 10/1998 | Wang et al. | 395/3 |
| 5,825,156 | A | 10/1998 | Patillon et al. | 320/21 |
| 6,064,180 | A | 5/2000 | Sullivan et al. | 320/132 |
| 6,081,096 | A * | 6/2000 | Barkat et al. | 320/124 |
| 6,104,967 | A * | 8/2000 | Hagen et al. | 700/293 |
| 6,255,801 | B1 | 7/2001 | Chalasani | 320/132 |
| 6,311,279 | B1 * | 10/2001 | Nguyen | 320/116 |

FOREIGN PATENT DOCUMENTS

| | | |
|---|---|---|
| FR | 2 734 061 | 11/1996 |
| WO | WO96/15563 | 5/1996 |
| WO | WO98/32181 | 7/1998 |
| WO | WO9832181 * | 7/1998 |
| WO | WO98/40951 | 9/1998 |
| WO | WO99/27628 | 6/1999 |
| WO | WO99/34224 | 7/1999 |

OTHER PUBLICATIONS

Adnan H. Anbuky, VRLA Battery Measurement and Discharge Reseerve Time, 1998, IEEE, Intelect (Cat. No. 98CH36263) pp. 302-310.*

International Search Report/PCT/NZ01/00182, May 29, 2002.

"IEEE Recommended Practice for Maintenance, Testing, and Replacement of Valve-Regulated Lead-Acid (VRLA) Batteries for Stationary Applications," IEEE Std 1188-1996, 16 pages.

Alber et al., "Impedance Testing—Is it a Substitute for Capacity Testing," Intelec 1994, 10-1, pp. 245-249.

Anbuky et al., "Knowledge Based VRLA Battery Monitoring and Health Assessment," IEEE, 2000, pp. 687-694.

Cun et al., "The Experience of a UPS Company in Advanced Battery Monitoring," Intelec 1996, 22-5, pp. 646-653.

International Search Report, PCT/NZ01/00183, Jul. 23, 2002.

Konya et al., "A Deterioration Estimating System for 200-Ah Sealed Lead-Acid Batteries," 1994 IEEE, pp. 256-262.

Kurisawa et al., "Capacity Estimating Method of Lead-Acid Battery by Short-time Discharge," Intelec 1997, pp. 493-490.

Kurisawa et al., "Internal Resistance and Deterioration of VRLA Battery Analysis of Internal Resistance Obtained by Direct Current Measurement and its Application to VRLA Battery Monitoring Technique," Intelec 1997, 29-3, pp. 687-694.

Markle, Gary J., "AC Impedance Testing for Valve Regulated cell," Intelec 1992, 9-4, pp. 212-217.

Ng et al., "Evaluation of a Reverse Time Prediction Algorithm for Lead Acid Battery," Intelec 1996, pp. 616-623.

Pascoe et al., "Estimation of VRLA Battery Capacity Using The Analysis of The Coup De Fouet Region," 1999 IEEE, 9 pages.

Pascoe et al., "VRLA Battery Capacity Measurement and Discharge Reserve Time Prediction," 1998 IEEE, pp. 302-310.

Suntio et al., "The Batteries as a Principal Component in DC UPS Systems," IEEE, 1990, pp. 400-411.

Supplementary European Search Report, EP 99 94 0753, Jun. 25, 2002.

Troy et al., "Midpoint Conductance Technology Used in Telecommunication Stationary Standby Battery Applications, Part VI, Considerations for Deployment of Midpoint Conductance in Telecommunications Power Applications," Intelec 1997, 29-4, pp. 695-702.

Yamamoto et al., "Deterioration Estimation Method for 200-Ah Sealed Lead-Acid Batteries," NTT Review, vol. 7, No. 4, Jul. 1995, pp. 65-69.

Yamashita et al., "A New Battery Check System in Telecommunications Power Plants," NTT Review, vol. 9, No. 3, May 1997, pp. 131-135.

* cited by examiner

BATTERY MONITORING NETWORK

FIELD OF THE INVENTION

The invention relates to a battery monitoring network.

BACKGROUND TO THE INVENTION

Battery monitoring objectives may be summarized as a) providing accurate and timely information on the battery reserve time, b) providing accurate and timely information on remaining battery life, c) providing recommendations to the optimal charging process that will allow for efficient charge recovery without sacrificing battery health, and d) informing the user on any possible maintenance action that supports system integrity. To meet these objectives continuous monitoring of real-time battery variables and trend data should take place. However, some battery monitors are still based on simple data logging that is supported by limit sensing. Centralized approaches in cell, or bloc, signal sensing is still dominant in the existing systems. Furthermore, a good part of the in formation extraction scenarios are far from being automated with most of the analysis being operator driven and test conducted on a periodic basis.

Efficient management of a battery network requires the smooth flow of timely and consistent information/data from the battery units (blocs, groups, strings and banks) to the various monitoring, management and control sites. The main issue related to implementing of real-time battery monitoring is voltage, temperature and current measurement. In particular, the ability to acquire accurate and timely voltage measurement is critical. The accuracy and resolution of the voltage measurement directly impacts on the accuracy and resolution of the derived information. This is especially important for capacity estimation utilizing the Coup De Fouet region. For thorough implementation (down to bloc level), the system is required to monitor the voltage of each bloc at the start of discharge at a frequency of up to 1 Hz.

However, battery networks vary in size. Systems could be as small as two strings of 24V mono-blocs. On the other hand, large systems could have tens of strings containing 24 blocs each. Normal practice is to partition the battery into a number of four string banks. Each string may contain blocs that are 2, 4, 6, or 12 volts. The 12-volt may be used as the common grouping factor that promotes relating the adjacent cells, whether they are six cells within a 12-volt mono-bloc or six individual adjacent blocs. The result is the need for substantial amounts of information to be acquired and processed in real-time. This causes consideration traffic overflow within the monitoring network in the case of centralizing the data processing.

Recently, the Internet connectivity to the site has also been encouraged. The approach presented is based on site-central connectivity. One approach is presented by O. Ludin in "An Operation and Maintenance Process Model for Energy Management" [Proceedings of the 21th International Telecommunication Energy Conference; Jun. 6-9, 1999, Copenhagen, 28-1 (7 pages)] which is based on the site as a Simple Network Management Protocol (SNMP) agent that interacts with the remote station using what is called energy management application software. Another approach is described in "Controlling and Alarming DC Power Plants via the Internet" [Proceedings of the 20th International Telecommunication Energy Conference; Oct. 4-8, 1998, San Francisco, PP 617-22, A. Cosentino & M. Sullivan] which implements the connectivity using a gateway that is based on an embedded PC operated by QNX real time operating system. However, both solutions are cost sensitive and limit the site to a central connection point.

A battery monitoring network is described in U.S. Pat. No. 6,104,967. A number of modules communicate with a central battery computer. The modules each include module computers which monitor various operations and status conditions within the module, including potential, current, and temperature conditions.

It is an object of the present invention to provide a generic network architecture for a battery monitoring system which can be implemented on existing open standard network protocols, is cost effective and efficient, and is inherently suited to internet connectivity; or to provide a system which at least overcomes or ameliorates some of the disadvantages with the prior art, or provides industry with a useful alternative.

Further aspects of the invention will become apparent from the following description.

SUMMARY OF THE INVENTION

In a first aspect the invention provides a battery monitoring network including a battery node; one or more distributed nodes of a first class each including means for acquiring first battery variable information, processing means adapted to manipulate the first battery variable information, and a communication means for communicating with the battery node; and one or more distributed nodes of a second class each including means for acquiring second battery variable information, processing means adapted to manipulate the second battery variable information, and a communication means for communicating with the battery node.

By using two different classes of distributed node (in contrast to U.S. Pat. No. 6,104,967 which has only a single class of distributed node), the present invention provides a more flexible network configuration. Each different class of node can also be optimized to deal with the particular type of information (for instance, voltage, temperature or current) that it is acquiring and manipulating.

Intelligence is distributed to a number of separate nodes, which may perform a variety of data manipulation algorithms to calculate various parameters such as reserve charge, coup de fouet parameters, reserve time etc. The distributed nodes may also compare the acquired battery variable information with one or more predetermined thresholds. The distributed nodes may also store historical information.

The distributed nodes may communicate with the battery node via a star-network configuration, or via a common bus. The use of a common bus is preferable since this also allows the distributed nodes to communicate with each other independently of the battery node.

Preferably the distributed nodes are arranged in two or more sub-networks, each sub-network communicating with the battery node via a respective sub-network junction Preferably, but not exclusively, each sub-network is interconnected by a router or other network interconnection means. Alternatively, each sub-network may be interconnected at the battery node.

Preferably the first class of distributed nodes are bloc nodes which each acquire information (typically voltage and/or temperature information) from a bloc of one or more serially connected cells, more preferably six cells. Typically a separate voltage reading is acquired from each cell. The temperature information may be bloc and/or ambient temperature.

Preferably the second class of distributed nodes are bank nodes which acquire information (typically current information) from of one or more serially connected blocs, conventionally known as a string, the strings being connected in parallel with each other. Preferably the bank nodes also store and manipulate trend and/or analysis information relating to the strings.

Preferably although not exclusively each sub-network has up to sixty-four nodes accommodating up to three banks (or strings) that comprises forty-eight bloc nodes.

Preferably the battery node is adapted to store and manipulate trend and/or analysis information. The battery node may store and manipulate trend and/or analysis information relating to one or more sub-networks which are interconnected by a router or other network interconnection means. Alternatively, there may be a battery node associated with each sub-network, the sub-networks being interconnected by the battery nodes.

Preferably the battery node includes a user interface and more preferably a graphical user interface. The battery node may also be coupled to an internet interface for remote access of battery information. A local user may also interface with the monitoring network via the battery node.

Preferably the operation and function of each node is configurable at the battery node.

In a second aspect the invention provides for a distributed knowledge based battery monitoring architecture for organizing information in a battery monitoring system including, separating the information into a hierarchy having at least two levels wherein a first, or bloc, level comprises information relating to the real-time bloc temperatures and voltages and a second, or bank, level comprises information relating to string current and inter-bloc voltages and temperatures. Preferably the hierarchy has three levels, a third, or battery, level comprising information relating to inter-string current analysis, data and information buffering and user interface screens.

The invention also provides for a battery monitoring system organized according to the above architecture.

Further aspects of the invention will become apparent from the following description which is given by way of example only and with reference to the following description.

BRIEF DESCRIPTION OF THE DRAWINGS

The invention will now be described with reference to the accompanying drawings in which.

DESCRIPTION OF THE PREFERRED EXAMPLE

Figure 1:
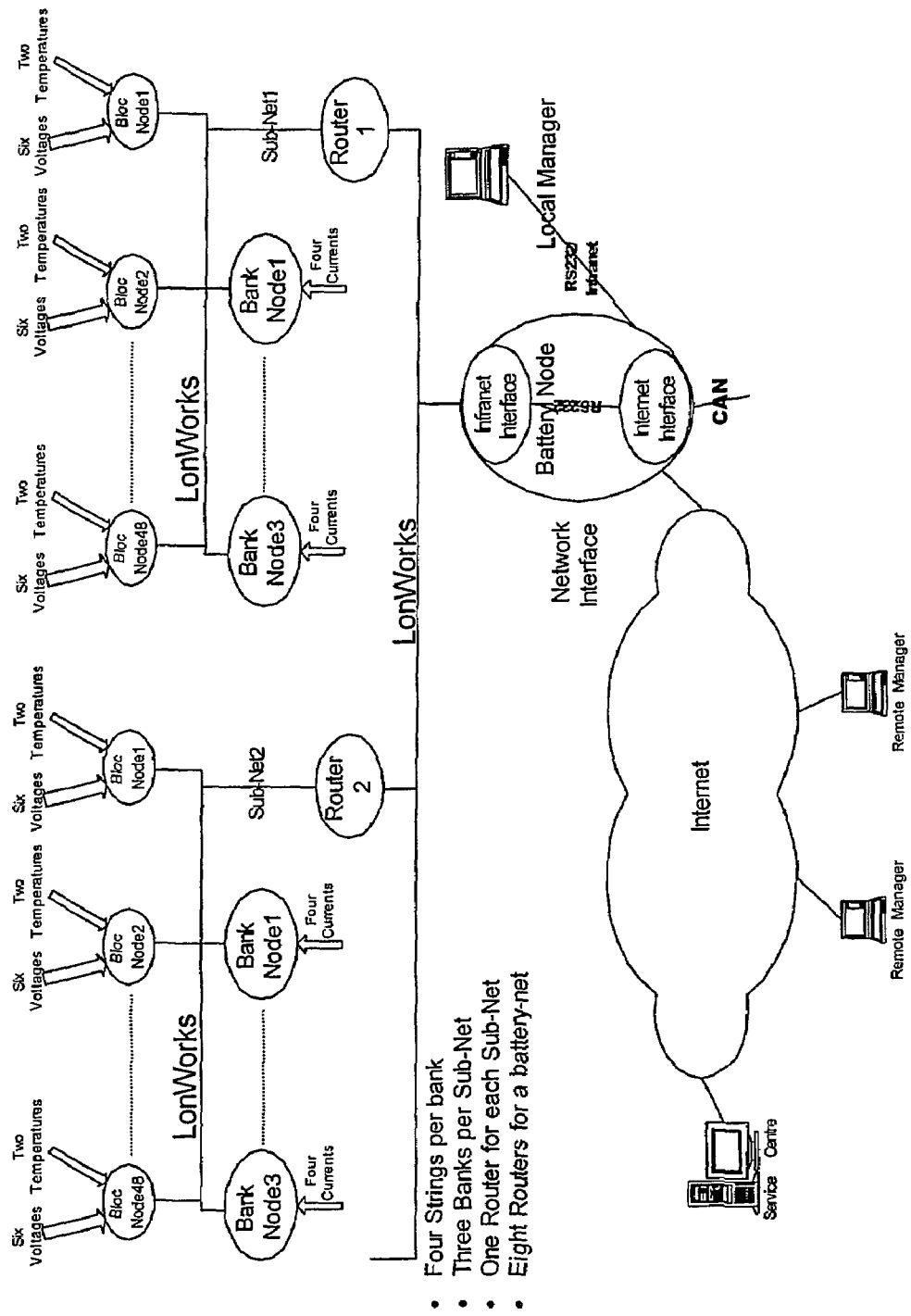
FIG. 1: illustrates a Battery Management System Architecture according to the invention.
Figure 2:
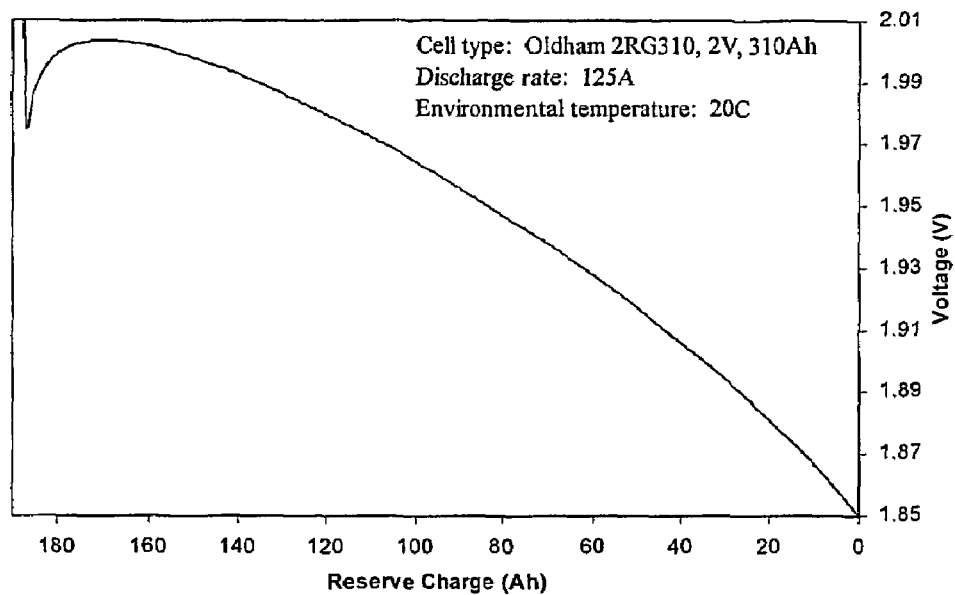
FIG. 2: illustrates Voltage vs. State-of-Charge at the Bloc level of the Battery Management System Architecture.
Figure 3:
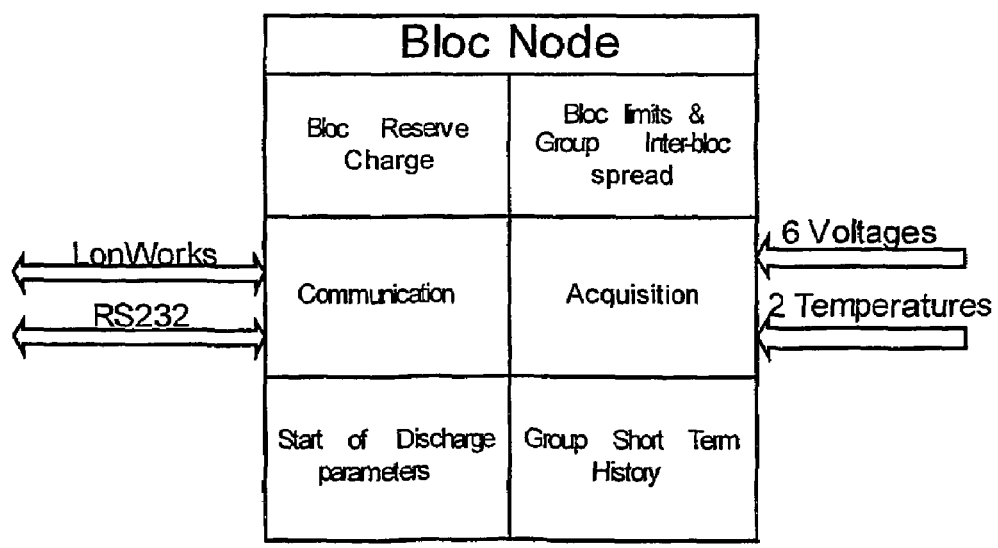
FIG. 3: illustrates node links and responsibilities at the Bloc level of the Battery Management System Architecture.

The invention will now be described with reference to the architecture for a VRLA battery management environment that allows for integration with the reset of a telecommunication power system. While the invention is described with reference to a telecommunication battery system the invention provides a generic battery monitoring and management architecture which may be applied to any battery installation. The generic battery monitoring and management architecture of the invention allows for a) a generic platform for knowledge distribution and information/data structures, b) a local communication organization which allows the architecture to be implemented on a propriety control network, c) internet connectivity and remote communication organization, and d) remote management, technical support and site collaboration.

In the following example of the invention there is a network architecture that monitors battery condition based on a number of generic monitoring nodes. Monitoring responsibilities are shared among these nodes. The solution is modular and allows for covering a wide range of battery networks using the same architecture and generic nodes.

In the example described the local network is based on LonWorks™ which provides the necessary environment for open system interconnection. However, it will be apparent to the skilled addressee that the architecture could be applied to other network platforms. The LonWorks™ Neuron chips allow for knowledge elements to be embedded within the local node. The network is organised so as to provide access to the battery bloc(s), string(s), and system. Each node is made responsible for a number of activities related to the associated bloc(s). Both real time and trend analyses are made locally.

The Internet interface is based on an embedded Java environment. Internet access could be made available to any device within the network either through a common or specific gateway. Connectivity could be organized on a battery level or even a battery sub-net level, allowing each sub-net to be connected or isolated individually. The organization facilitates an environment to structuring the battery knowledge that allows a consistent and effective user interface for battery management. Integrated with the rest of the power system could be made through the Internet, allowing for full implementation of system management actions such as smart charge control.

Network Architecture

Batteries are categorized as being loosely coupled to the system within the telecommunication power system. They contribute to the support of the load when the rectifiers are down. They are living at float voltage most of the time. When charging, or when a discharge test is conducted, the process will be pre-programmed. They could therefore be considered as being loosely coupled to the system. Parts of the battery could be isolated or integrated without affecting the integrity of the system. This allows the battery management to be a class of its own. A network organization to this class may have its own natural structure. It may also be considered as a sub-net within the rest of the power system network.

A first example of a management system architecture is illustrated by FIG. 1. The network is partitioned into a group of sub-nets, each of which contains a number of bank nodes and bloc nodes. Each bank node acquires current from four battery strings (not shown). Each string is partitioned into groups of cells, each group of cells being a bloc. The bloc nodes each acquire real time data from a respective battery bloc. In the system of FIG. 1, each battery sub-network accommodates up to three bank nodes, each bank node monitoring four strings with each string being made up of four blocs of six two-volt cells. In this case the sub-network will monitor twelve 48V strings. In an alternative configuration (not shown) the sub-network may be configured to monitor twenty-four 24V strings. When the network required is larger than the sub-network capacity, routers are used to connect more than one LonWorks™ sub-network to the network. An alternative to the use of routers is the use of the Internet gateway for each sub-net. Using the Internet would however introduce some latency in real-time interaction as related to the battery information integrity.

A battery node acts as the network gateway to the Internet. Two processing units are implemented here. The first is the Infranet interface and the second is the Internet interface. Communication between these two units is done through an RS232 serial bus. The Internet interface acts as a gateway to the Internet supporting the flow of battery data and information. This allows one or more remote mangers to communicate with the battery network by interrogating the various nodes. It also allows for a local manager to communicate with the network.

A repository of medium-term battery information and historical data is facilitated at the battery node. Here the battery node provides a central data point to the local and various remote management stations, maintaining consistency in handling battery monitoring and management actions. The Internet interface also has a provision for facilitating routing to a CAN network.

This organisation allows for accessing the individual blocs. The various nodes related to blocs, strings and battery, exercise data processing as well as communication. Basic knowledge elements are distributed among the nodes, allowing each of these nodes to play a role in inferring short-term battery conditions. Involved knowledge elements related to long-term analysis are located at the service centre. Both remote and local managers utilise such analysis.

Local Network

The local network is referred to as the network that links the computation facilities at the battery site. This covers the bloc nodes, the bank nodes, the battery node and the local manager station. These are considered as the core elements that co-operate in performing the data acquisition, data processing, short-term data and information logging and configuration of the battery monitoring system. The local user interaction is also considered as part of this network. The local manager provides a local access to the battery information.

A LonWorks™ peer-to-peer network based on ISO/OSI seven-layer model of open system interconnection has been used as a typical example for a commercially available technology. LON nodes are capable of being application specific intelligent devices. Knowledge could be embedded into each of these nodes to make them perform dedicated activities related to battery data acquisition and processing. The addressing supports large networks with multiple channels and allows the implementation of low cost routers.

Bloc Node

The bloc node is designed to cater for monitoring a group of six two-volt cells. This provides a trade-off between the processing requirements of the bloc node and the size of the sub-network. It also promotes the design of internal cell monitoring of a twelve-volt mono-bloc as an embedded solution. The channel electrical characteristics of 78 kbps twisted pair media limits the number of subnetwork nodes to 64, allowing for up to 12 strings of 48V. The bloc node provides pilot temperature sensing for the group of six cells as well as close-by-ambient temperature sensing.

The bloc node acquires voltage samples at a rate of one per second, representative readings being sent over the network at a rate of up to once every 10 seconds. The bloc node also samples the temperature once every 30 seconds and evaluates the state of charge once every minute. This is based on the voltage vs. state-of-charge relationship which is described in the Applicant's earlier patent application published as WO 00/13288. It does perform other functions. The responsibilities of the bloc node are summarised by the following:

Acquire the group data related to voltages and temperatures.

Establish a short-term data and information history related to the group.

Work out lowest and average reserve charge on discharge.

Figure 4:
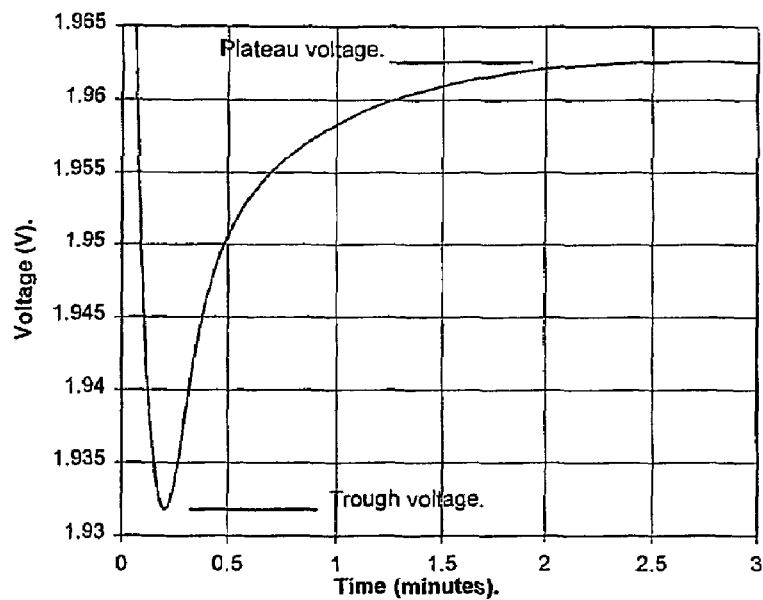
FIG. 4: illustrates the accuracy and sampling rate needed at the Coup de Fouet region.
Figure 5:
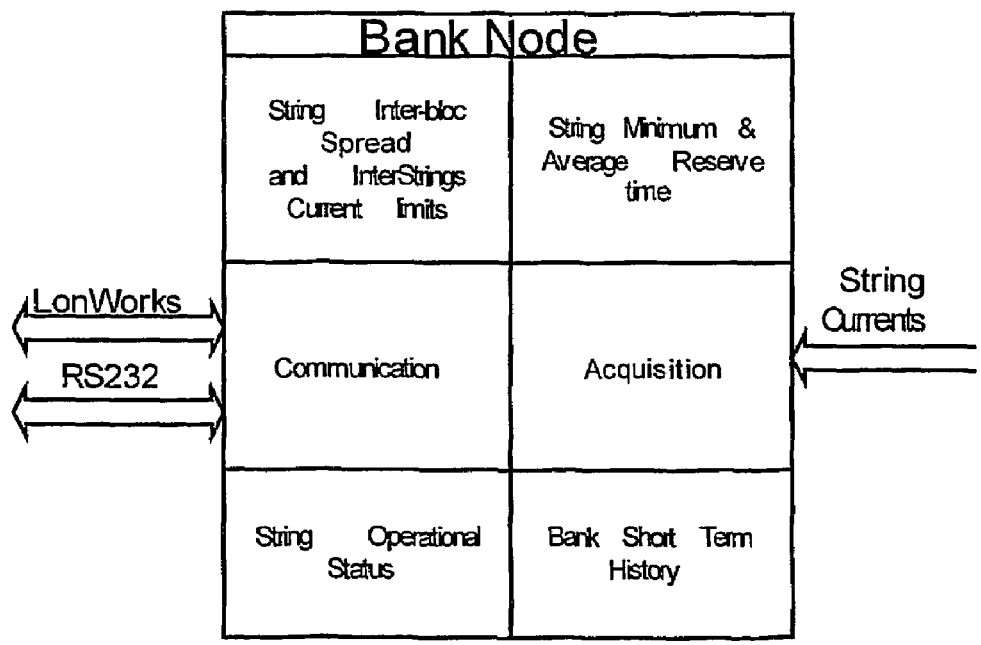
FIG. 5: illustrates node responsibilities and interconnections at the Bank level of the Battery Management System Architecture.
Figure 6:
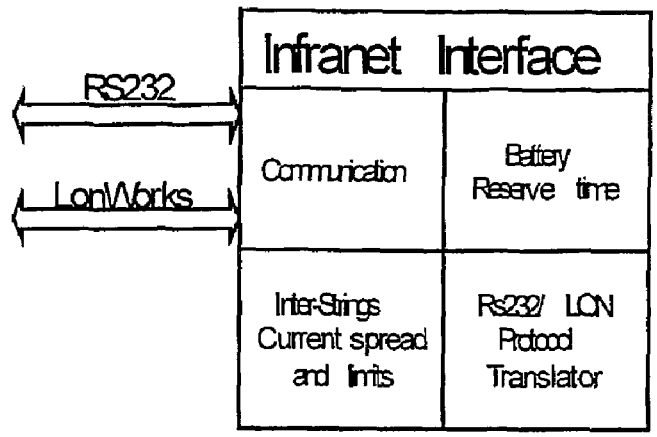
FIG. 6: illustrates intranet interface responsibility and interconnection at the Battery level of the Battery Management System Architecture.
Figure 7:
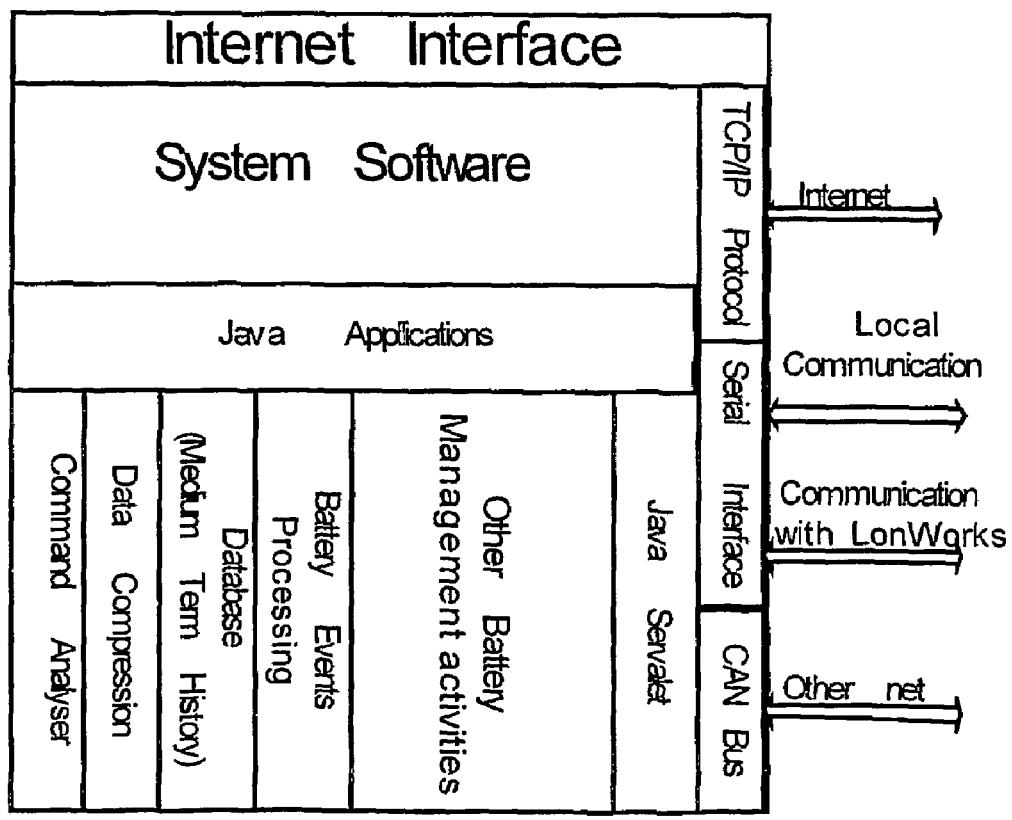
FIG. 7: illustrates internet interface responsibilities and interconnection at the Battery level of the Battery Management System Architecture.

Detect the coup de fouet parameters just after the start of the discharge (see FIG. 4).

Detect end voltage.

Detect inter-bloc maximum & minimum.

Communicate with the network.

Retain identification of the group.

Retain short term history on group data and status conditions

Calculate temperature or voltage limit violations—for example calculate voltage difference between cells in each bloc and determine whether this has exceeded a predetermined maximum, or calculate difference between bloc temperature and ambient temperature and determine whether this has exceeded a predetermined maximum Each of the bloc nodes samples the associated bloc voltages, pilot bloc temperature and close-by ambient temperature at a rate appropriate to battery needs. Measurement accuracy and sampling rate should be sufficient to cater for capturing meaningful events. The most critical information that requires high accuracy and sampling rate is the start of discharge parameters (see FIG. 4). Investigation related to this region has reflected its significance in providing information on the battery capacity. This is described in Applicant's earlier patent application Number PCT/NZ00/00089. The samples are checked against previous samples and considered for logging and processing when they present a predefined incremental change, a maximum or a minimum. A limited memory is allocated for the short term logging of the data and events related to each bloc.

Processing at the bloc node provides information related to bloc reserve charge and bloc limit violations. It also discovers essential information related to the start of the discharge. The bank node communicates with the bloc node for deriving the string-related information, as described in more detail below. Messages related to bloc data and events are sent to the battery node, which acts as a gateway to the external world. Configuration messages related to this node will also be received from the battery node. These are mainly related to alarm limits, state of charge characterisation as well as initial battery identification.

The bloc node could be physically attached to or embedded in the battery bloc/cell.

Bank Node

The bank node fulfils the job of string management and inter-string monitoring. This handles up to four strings. It acquires the string currents at a rate of one sample per second. The current value is used in detecting the switching in string operational status (i.e. charge to discharge and vice versa). It is also used to calculate and hence report on the remaining time of the lowest and average bloc for each string during discharge. The node also determines the voltage and temperature spread for each string (based on data received from the bank nodes associated with each string) and reports on any conditions that exceed the set limits. This will allow the upper level computational units where the database resides, to work out the persistence in each of these elements and to issue relevant alarms. The following are a summary of the bank node responsibilities:

- Work out the string spreads for inter-bloc voltages, inter-group temperature and identify any violations of the set limits of these spreads.
- Acquire string currents.
- Establish short-term string level history.
- Identify string status (charging or discharging), and inform bloc nodes of status change events.
- Communication with the network.
- Determining string minimum and average reserve time.

Battery Node

The battery node is responsible for interfacing the LON battery Infranet to the external world. Here bi-directional message flow is facilitated. This will allow information related to battery data and events to flow upward to the battery database. It will also allow commands for network configuration or information queries to flow downward to the various nodes.

Two main units are co-operating at this node. These are a) Infranet (LON) Interface and b) Internet Interface. The Infranet interface provides the LonWorks™ gateway to the Internet interface. The Internet interface connects the battery Infranet to the local and remote management stations. The roles of each of these units are given in the following sections.

Infranet Interface

This unit facilitates the interface between the Infranet and the Internet interface unit. Data on each string is updated as it is received through the network. It will then be forwarded to the Internet interface unit once every 10 seconds. The current spread of all strings is analysed. When this spread exceeds the limit a message will be sent to the Internet interface at a pre-specified interval. The following responsibilities are allocated to the Battery Node:

- Analyse string current spread.
- Work out the battery wide average and worst case reserve time.
- Communicate with bloc and string nodes.
- Communicate with Internet interface.
- Establish medium term history on battery data and status Real time battery data and events are received by this node and passed to the Internet interface unit. The data is clustered in a string-by-string basis. This allows room for some significant data compression. Commands are received from the Internet interface unit related to node configuration or request for information from any of the working nodes. These are translated into LON messages and forwarded to the associated node. This node is also responsible for catering with battery-wide inter-string comparison and battery reserve time.

The mechanism for communication between the Infranet interface and Internet interface will play a major role in determining the information flow capacity. A good percentage of telecommunication sites have less than 12 strings (one subnetwork). Here, a software solution would be sufficient to absorb the network requirement. Further expansion to increase the communication speed is also possible through a hardware solution. One option is to have one Internet interface per sub-net. The size of the associated battery system would justify the cost. This will also provide redundancy that will ensure system security as well as design simplicity and cost optimisation.

Internet Interface

Battery information could be utilised by a number of clients. A site technician might view it locally. A remote service centre or one or more remote managers may also be associated with the system. The Internet is now receiving much greater acceptance within the telecommunication community. Integration of voice and data networks is good evidence to that. The network interface maintains the following requirements:

- Information integrity and consistency.
- Information security and access control.
- Compatible network performance.

The use of an Internet gateway to interconnect the LonWorks™ network to the various remote sites would provide the infrastructure for the interface requirement. This has to be associated with other functionality that allow for the required consistence and access control.

The system interface is the gateway for interconnecting the LonWorks™ battery network to the Internet. This has been implemented using the Dallas TINI™ Internet interface product. The TINI™ is based on an embedded Java Virtual Machine (JVM). In addition the platform has a multitasking real time scheduler that allows for up to sixteen concurrent tasks. The Internet protocol is supported by the necessary TCP/IP network stack. These resources provide reasonable backup for the interfacing requirement. The unit supports a substantial storage backup that could be utilised for medium-term battery history. This provides a central point for accessing the battery real time and trend data.

The roles allocated to the Internet interface are summarised below:

- Establish medium term battery database.
- Compress battery data.
- Generate information summary.
- Provides/Updates the user interaction Applets to the remote users through the Internet.
- Communicate with remote user via the Internet (TCP/IP Protocol).
- Communicate with local user via the Intranet or the RS232 serial bus.
- Communicate with battery network via the RS232 serial bus.

The Internet interface may also be used to perform battery management activities like battery capacity tests or battery charging.

Data Compression

Data compression is an important aspect of the battery central interaction point. Due to the limited size of the available backup storage, effective compression is needed to cover a good part of present (real-time) and nearby history of the battery behaviour. This helps in improving performance in terms of network traffic and speed of retrieval.

Figure 8:
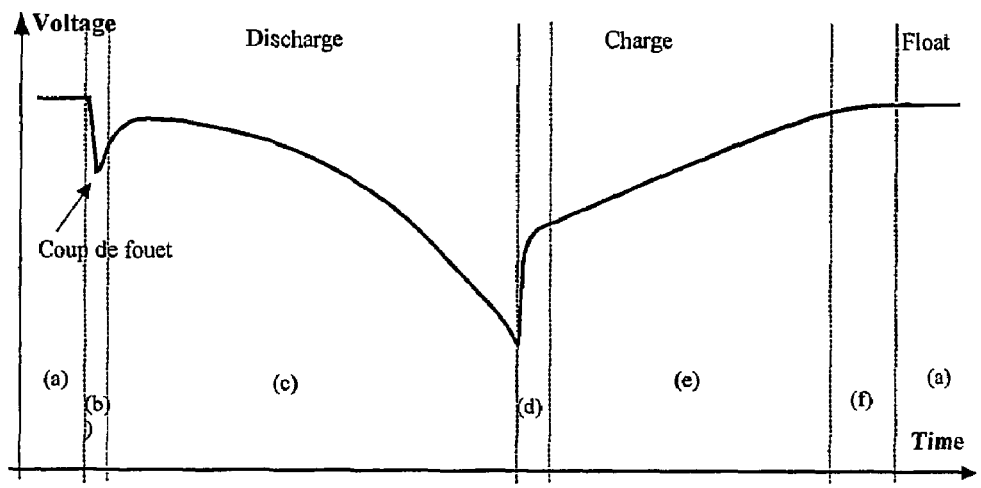
FIG. 8: illustrates a sectioned voltage curve for a single cell at a Bloc Node.
Figure 9:
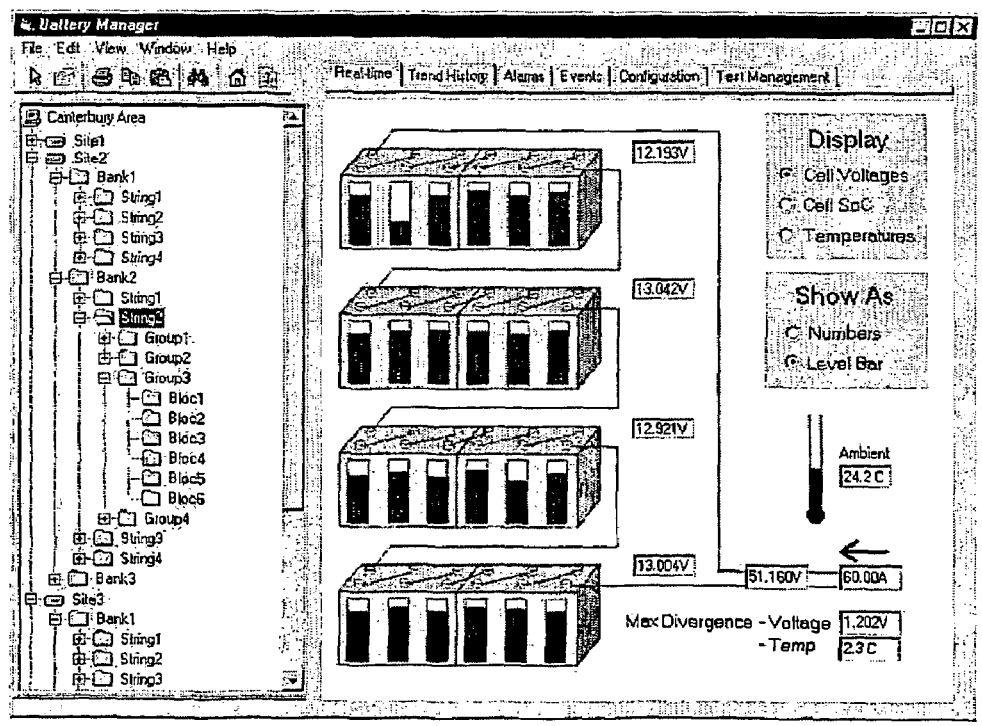
FIG. 9: illustrates a user interface view showing real-time status of variables at various nodes of the Battery Management System Architecture.
Figure 10:
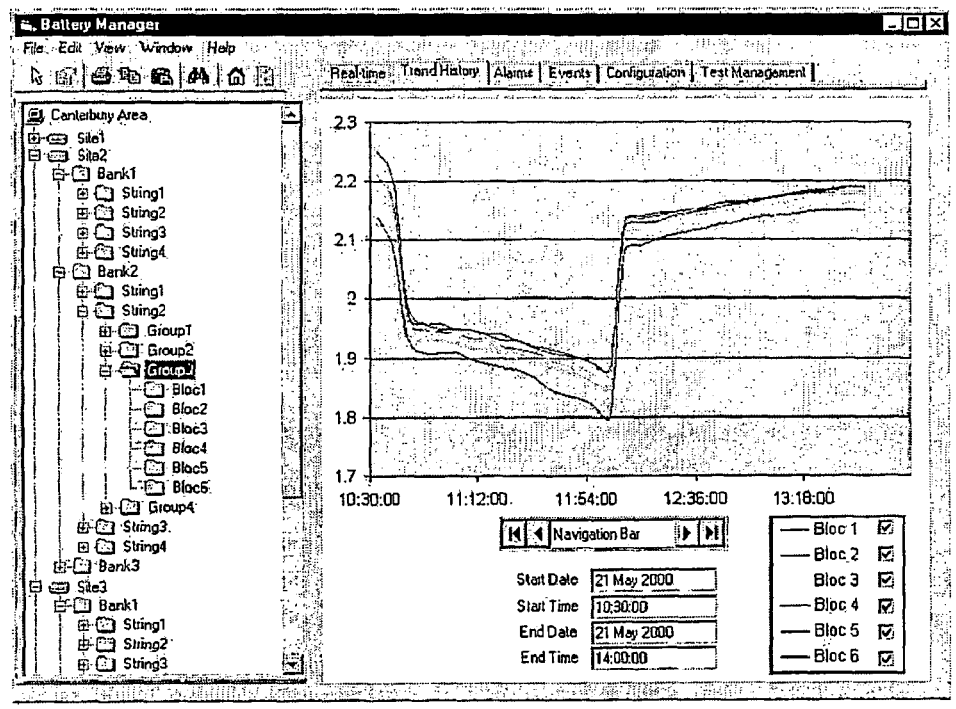
FIG. 10: illustrates a user interface view showing history trend.
Figure 11:
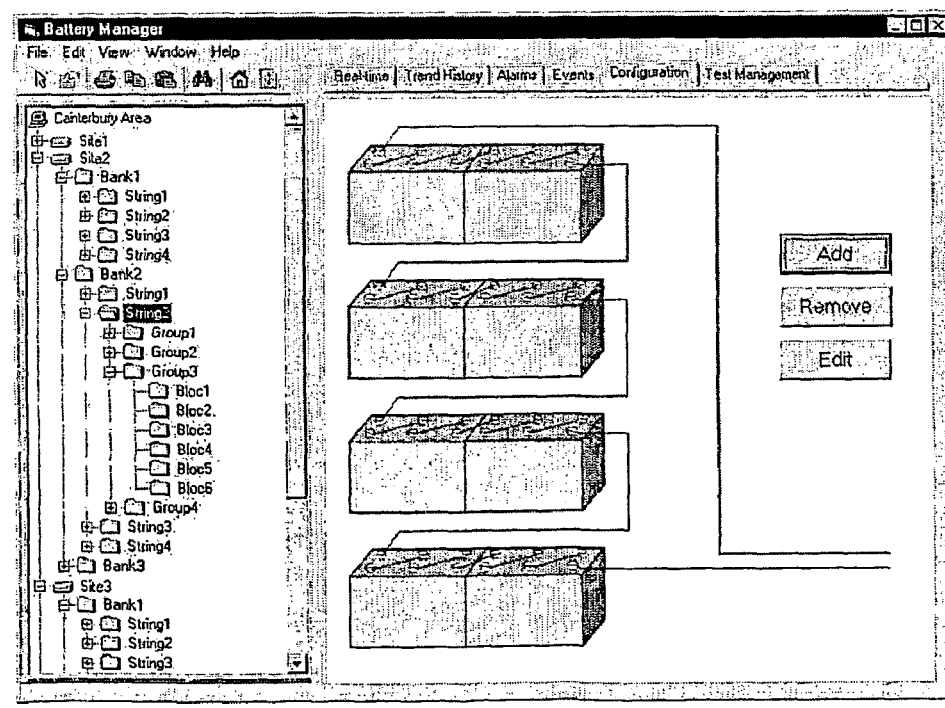
FIG. 11: illustrates a user interface view showing battery configuration.
Figure 12:
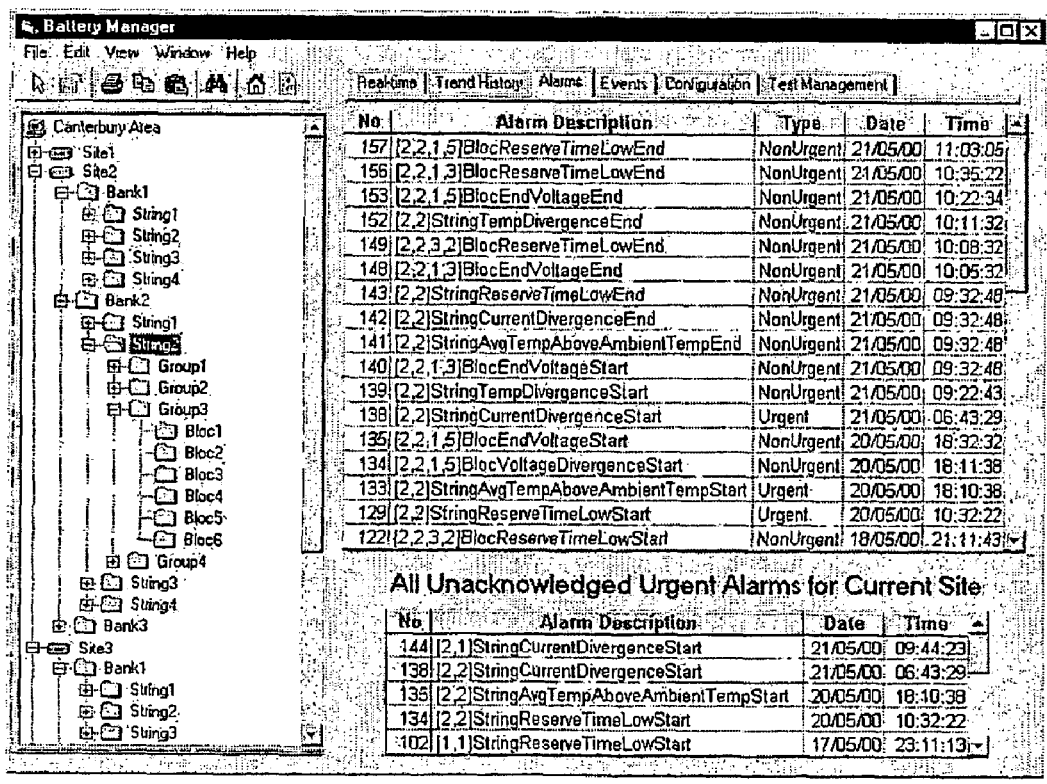
FIG. 12: illustrates a user interface alarm page.

The compression strategy is based on both logical and signal analysis of the battery system. The following aspects are taken into consideration in system logical partitioning:

Group the data on a string-by-string basis.
Partition the trend into the main regions of charge, float and discharge (see FIG. 8).
Partition each of the these regions into fast and slow varying regions (see FIG. 8)
Apply an appropriate compression method for each of these parts. The method should be able to retain the key information/data that is relevant to that region.

The data to be stored is made up of two main aspects, system messages/alarms, and historical data. The majority of relevant information is in the form of historical data. This needs to be the focus of compression.

Most of the analysis is based on the voltage curves of the battery. To effectively compress and store these curves the curve is split into different sections according to string status and signal rate of variations. For example, to reconstruct the coup de fouet region effectively, a much larger number of samples per unit time would be needed than other parts of the discharge curve. A possible method of sectioning a common charge and discharge curve is shown below in FIG. 8.

Before the compression takes place, the Internet interface must decide on the status of the string. This is done either by notification from the bank node as the change of status takes place, or by the Internet interface interpreting change in status.

In a slowly varying region, a reading is stored when the voltage of the fastest varying bloc is exceeding a predefined increment.

For the fast varying sections of the voltage curve, there are many possible techniques that could be used for data compression. A similar technique to that used for the slowly varying signals may be used. This threshold value can be set according to how accurately the curve is to be reconstructed. An alternative method that has the potential to store the data more effectively is to use polynomial fitting to the different parts of the curve. This however, introduces processing overhead on the TINI™ during the time of compression or reconstruction.

To minimise the actual space that the data uses on the Internet interface's battery-backed RAM file system, the data is stored in a custom database with the data types being appropriate to the range and accuracy of the readings. The data is stored in a compact binary format to fully utilise the available memory. The timestamp is converted to Julian time before storing in the database.

Further minimisation could be made by monitoring the behaviour of the majority of blocs and accordingly deal with the bloc in isolation or as part of the string. Here, if more than half of the cells in the string are at a higher rate than the rest, all the string voltages will be recorded with one timestamp at that higher rate. If less than half the cells are recording at a higher rate, then these cells will be saved to the database individually. This is because the timestamp takes the same space as a single reading for a single cell of the string (two bytes), so this configuration will minimise the space used of the database.

Local Manager

A local manager may access the network for regular routine checks or for performing system installation or maintenance. The access to the network is made through the system interface. The user may be able to view real time battery data and messages or historical information from the battery database within the TINI™. The user may also perform system configuration or battery tests as authorised by the service centre. The local manager may also be authorised by the service centre in conducting required tests. The responsibilities of the local manager are summarised as follows:

Physical node structure configuration
Real-time data display
Messages and alarms
Historical information (trends and events)
Test schedule Remote Manager The site associated remote manager assumes authority over any critical maintenance action related to the site. This includes nodes configuration, battery testing, bloc replacement etc. The remote manager can also view the battery real time and trend data and messages. Both medium and long-term history could be used. A remote manager can be located anywhere on the global Internet. Collaborative elements within the monitoring views would allow the remote manager to authorise the service centre in conducting a test.

Service Centre

The service centre acts as the maintenance consultation centre. It stores the long-term historical data and alarm messages related to the battery. It also co-ordinates with both remote managers and the site manger in conducting a battery test. The service centre will also handle any requests for trend information that have expired from the Internet interface's medium-term database. The site manager may assume the role of this centre.

User Interface Views

Remote interaction with the battery system is done through Java applets. They are hosted at the TINI™ to support the user interaction at each of the remote sites. These Applets will facilitate the various interactive views. These views should address the various forms of access each remote or local station may have and relate to their responsibilities.

FIGS. 9, 10 11 and 12 show sample views of a possible user interface applet. A tree-view on the left-hand side of each screen is used for navigation of all the nodes in the system. The user is able to change between all the different available views for any node in the system, while still using the same screen method for navigating these views. This provides a familiar and consistent feel. All the details of the system data, trends, alarms, events, configuration details and the test management schedule are shown in the right-hand section of the window as they are selected. The multiple dimensional browsing provides effective and fast interaction with the data and information delivered by the system.

The alarm and events screens allow the user to browse through the alarms and events chronologically. The tree provides a filter to the information you want to display. The numbers at the front of the alarm description indicate the location of the alarm. A sub-window is made available for the urgent alarms that have not been attended to. This structure provides a method of fast interaction with important aspects related to battery management.

Figure 13:
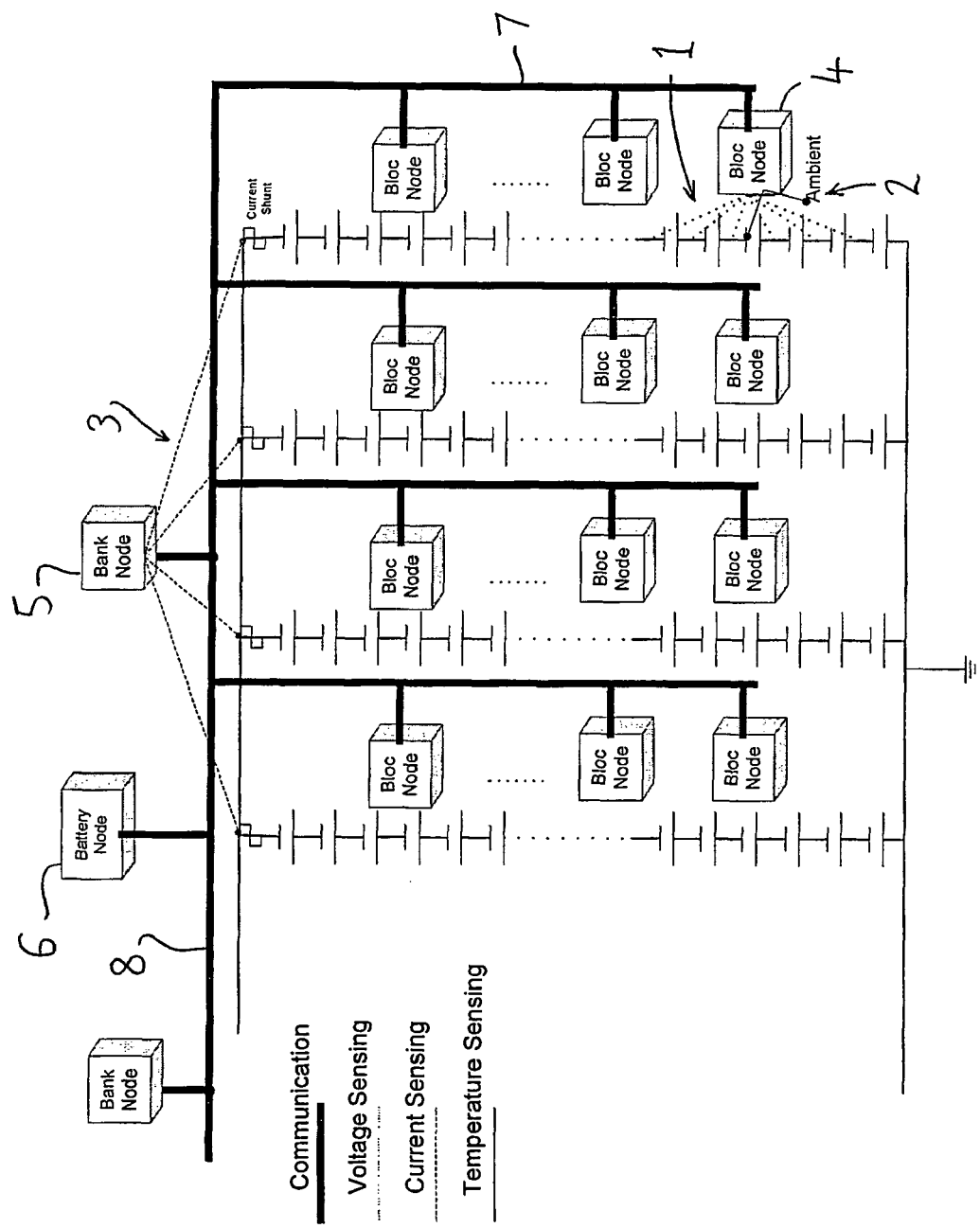
FIG. 13: illustrates an alternative network architecture.

An alternative battery monitoring architecture is shown in FIG. 13. This Figure shows the voltage sensors 1, temperature sensors 2 and current sensors 3 which are coupled to the bloc nodes 4 and bank nodes 5. Battery node 6 is also shown. In contrast to FIG. 1, the bloc nodes 4 associated with each string are coupled to a respective string bus 7, which in turn is connected to the common bus 8.

Where in the aforegoing description reference has been made to elements or integers having known equivalents, then such equivalents are included as though individually set forth.

Although the invention has been described by way of example and with reference to particular embodiments, it is understood that modifications and/or improvements can be made without departing from the scope thereof.

The invention claimed is:

1. A battery monitoring network including a battery node; one or more distributed nodes of a first class each including means for acquiring first battery variable information, processing means adapted to manipulate the first battery variable information, and a communication means for communicating with the battery node; and one or more distributed nodes of a second class each including means for acquiring second battery variable information, processing means adapted to manipulate the second battery variable information, and a communication means for communicating with the battery node, wherein the distributed nodes are arranged in two or more sub-networks, each sub-network communicating with the battery node via a respective sub-network junction, each sub-network including one or more distributed nodes of the first class and one or more distributed nodes of the second class.

2. The network of claim 1 wherein the nodes of a first and/or second class each include a memory for storing the battery variable information and/or the results of manipulating the battery variable information.

3. The network of claim 1 wherein the first battery variable information includes voltage information.

4. The network of claim 1 wherein the first battery variable information includes temperature information.

5. The network of claim 1 wherein the second battery variable information includes current information.

6. The network of claim 1 adapted to monitor a battery which includes a plurality of blocs each comprising one or more serially connected cells and a plurality of strings each comprising one or more serially connected blocs, the strings being connected in parallel with each other, wherein the distributed nodes of a first class are bloc nodes each adapted to acquire information relating to one or more of the blocs, and wherein the distributed nodes of a second class are bank nodes each adapted to acquire information relating to one or more of the strings.

7. The network of claim 1 wherein the number of distributed nodes of a first class exceeds the number of distributed nodes of a second class.

8. The network of claim 1 wherein the battery node includes a processor for manipulating data received from the distributed nodes.

9. The network of claim 1 wherein the battery node includes a graphical user interface.

10. The network of claim 1 including an internet interface coupled to the battery node.

11. The network of claim 1 wherein the distributed nodes of a first class are adapted to communicate with the distributed nodes of a second class.

12. The network of claim 1 wherein each sub-network includes a respective router for routing data through the respective sub-network junction.

13. The network of claim 1 wherein the distributed nodes communicate with the battery node via a common bus.

14. The network of claim 1 wherein the battery node includes means for communicating data to the distributed nodes.

15. The network of claim 1 wherein each distributed node is adapted to receive battery variable information from a plurality of sensors.

16. The network of claim 1 wherein the distributed nodes of a first and/or second class are adapted to compare the battery variable information with one or more predetermined threshold values.

17. The network of claim 1 wherein the distributed nodes of a first class are adapted to acquire coup de fouet parameters during battery discharge.

18. The network of claim 1 adapted to monitor a valve regulated lead acid (VRLA) battery.

19. A VRLA battery in combination with the network of claim 18.

20. A battery monitoring network comprising:
a battery node;
one or more distributed nodes of a first class configured to generate first battery variable information;
one or more distributed nodes of a second class configured to generate second battery variable information; and
a communications network coupling the battery node, the one or more distributed nodes of the first class, and the one or more nodes of the second class,
wherein the battery node, the one or more nodes of the first class and the one or more nodes of the second class are configured to conduct peer-to-peer communications over the communications network.

21. The battery monitoring network of claim 20 wherein the one or more distributed nodes of the first class and the one or more distributed nodes of the second class are configured to monitor respective different types of arrangements of cells.

22. The battery monitoring network of claim 21 wherein the one or more distributed nodes of the first class are each configured to monitor a bloc of cells, and wherein the one or more distributed nodes of the second class are each configured to monitor one or more strings of blocs.

23. The battery monitoring network of claim 22 wherein the first battery variable information comprises bloc-related information and wherein the second battery variable information comprises string-related information.

24. The battery monitoring network of claim 23 wherein the one or more distributed nodes of the second class are configured to derive the string-related information from bloc-related information received from the one or more distributed nodes of the first class.

25. The battery monitoring network of claim 20 wherein the communications network comprises an intranet, and wherein the battery node is configured to interface the intranet to a public internet.

26. The battery monitoring network of claim 20 wherein the first battery variable information includes voltage information and/or temperature information, and wherein the second battery variable information includes current information.

* * * * *

UNITED STATES PATENT AND TRADEMARK OFFICE
CERTIFICATE OF CORRECTION

PATENT NO.       : 7,576,518 B2                                    Page 1 of 1
APPLICATION NO.  : 10/363460
DATED            : August 18, 2009
INVENTOR(S)      : Sanders et al.

It is certified that error appears in the above-identified patent and that said Letters Patent is hereby corrected as shown below:

Column 1, line 2, Please add
--Cross-Reference to Related Applications
The present application is a U.S. national phase application of PCT International Application No. PCT/NZ01/00182, having an international filing date of September 4, 2001 and claiming priority to New Zealand Application No. 506674, filed September 4, 2000, the disclosures of which are incorporated herein by reference in their entirety. The above PCT International Application was published in the English language as International Publication No. WO 02/21662.--

Column 12, Claim 25, Line 51: Please correct by inserting --further-- before "configured".

Signed and Sealed this

Tenth Day of November, 2009

David J. Kappos
*Director of the United States Patent and Trademark Office*